United States Patent
Miyata (10) Patent No.: US 7,599,232 B2
(45) Date of Patent: Oct. 6, 2009

(54) SEMICONDUCTOR MEMORY DEVICE (75) Inventor: Masaki Miyata, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 145 days.

(21) Appl. No.: 11/826,109

(22) Filed: Jul. 12, 2007

(65) Prior Publication Data
US 2008/0049539 A1    Feb. 28, 2008

(30) Foreign Application Priority Data
Jul. 13, 2006    (JP)    ............... 2006-193014

(51) Int. Cl.
G11C 7/00    (2006.01)
(52) U.S. Cl. ............... 365/189.14; 365/189.16; 365/154; 365/230.06
(58) Field of Classification Search ............ 365/185.23, 365/189.16, 189.14, 230.06, 154
See application file for complete search history.

(56) References Cited
U.S. PATENT DOCUMENTS
5,513,147 A * 4/1996 Prickett, Jr. ............ 365/230.06
5,808,956 A * 9/1998 Maruyama ............. 365/230.06
6,084,804 A * 7/2000 McPartland ............ 365/189.11
6,339,344 B1   1/2002 Sakata et al.
7,184,358 B2   2/2007 Kobayashi et al.

FOREIGN PATENT DOCUMENTS
JP    2000-306382    11/2000
JP    2005-158223    6/2005
JP    2005-192234    7/2005

* cited by examiner

Primary Examiner—Pho M. Luu
(74) Attorney, Agent, or Firm—Young & Thompson (57) ABSTRACT A word line driving circuit includes first, second, and third MOS transistors. Gates of the first and second transistors are commonly connected. Sources of the first and second transistors are connected to different power supplies. The third transistor is connected between the drains of the first and second transistors. A connection node between the drains of the second and third transistors is connected to a word line. When the input signal is set to a high level and the second transistor is turned on, a potential lower than a high level of the input signal is supplied to a gate of the third MOS transistor. A signal with a high level thereof being lower than a high level of the input signal, or a fixed GND potential is supplied to the gate of the third transistor.

18 Claims, 9 Drawing Sheets

10': WORD LINE DRIVING CIRCUIT

SECTION WITH WORD THEREOF SELECTED

SEC0
SEC1
SEC2
SEC3
⋮
SEC31

FIG. 3B

SEC0
SEC1
SEC2
SEC3
⋮
SEC31

WORD SELECTION PERIOD

| MODE | STATE | SEC | MWLB | RAI | RAIB | WL |
|---|---|---|---|---|---|---|
| NORMAL OPERATION MODE | WORD SELECTED | -0.5 | -0.5 | 3.5 | 0 | 3.5 |
| | WORD NOT SELECTED | 2.5 | 3.5 | 0 | 3.5 | -0.5 |
| STANDBY MODE | WORD SELECTED | -0.5 | -0.5 | 3.5 | 0 | 3.5 |
| | WORD NOT SELECTED | 2.5 | 3.5 | 0 | 3.5 | -0.5 |

UNIT [V]

※ SET VOLTAGES ARE AN EXAMPLE

FIG. 7

FIG. 8    RELATED ART
10'': WORD LINE DRIVING CIRCUIT

FIG. 9    RELATED ART

EXAMPLE OF VOLTAGE SETTING
IN CONVENTIONAL WORD LINE DRIVING CIRCUIT

| MODE | STATE | MWLB | RAI | RAIB | WL |
|---|---|---|---|---|---|
| NORMAL OPERATION MODE | WORD SELECTED | -0.5 | 3.5 | 0 | 3.5 |
| | WORD NOT SELECTED | 3.5 | 0 | 3.5 | -0.5 |
| STANDBY MODE | WORD SELECTED | -0.5 | 3.5 | 0 | 3.5 |
| | WORD NOT SELECTED | 3.5 | 0 | 3.5 | -0.5 |

UNIT [V]

※ SET VOLTAGES ARE AN EXAMPLE

SEMICONDUCTOR MEMORY DEVICE

RELATED APPLICATION

This application is based upon and claims the benefit of the priority of Japanese patent application No. 2006-193014, filed on Jul. 13, 2006, the disclosure of which is incorporated herein in its entirety by reference thereto.

FIELD OF THE INVENTION

The present invention relates to a semiconductor memory device. More specifically, the invention relates to a word line driving circuit.

BACKGROUND OF THE INVENTION

In recent years, a battery holding time of a mobile phone terminal has been prolonged, and lower power consumption of a dynamic memory which requires refreshing for holding cell data and which is mounted on, such as a mobile phone terminal, is also demanded. As the dynamic memory mounted on a mobile phone terminal or the like, there are provided a DRAM (a dynamic random access memory) and a pseudo SRAM in which a memory core is formed of DRAM cells, and which is compliant with SRAM (static random access memory) interface specifications.

It is particularly important to reduce a consumption current (a standby current) of the dynamic memory at a time of standby in order to prolong a battery holding time in a waiting state that occupies a large portion of a usage state of the mobile phone terminal.

On the other hand, in the dynamic memory (DRAM or pseudo SRAM), selection of a word line (at a high level) is controlled by a boosted voltage higher than en external supply voltage in order to improve a margin for reading data which has been stored at a high level in a memory cell.

Further, in order to reduce sub-threshold leakage of a cell transistor, a level (a low level) of a word line when not selected is set to the level lower than a ground (GND) potential.

Figure 8:
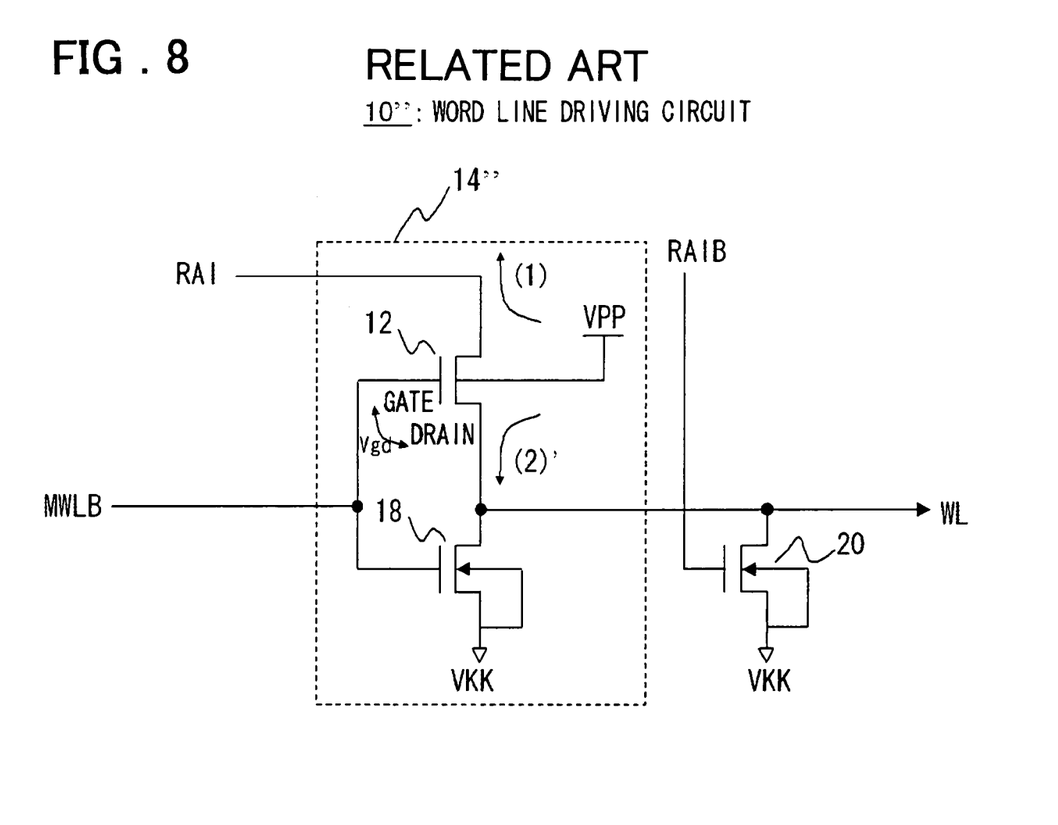
FIG. 8 is a diagram showing a typical configuration of a word line driving circuit of the related art.

FIG. 8 is a diagram showing a typical example of a configuration of a word line driving circuit of the related art. Referring to FIG. 8, a word line driving circuit 10" includes a PMOSFET 12 with a source thereof connected to a line (a sub-word decode line) RAI and an NMOSFET 18 with a source thereof connected to a power supply VKK. Gates of the PMOSFET 12 and the NMOSFET 18 are connected in common to a main word signal MWLB. Drains of the PMOSFET 12 and the NMOSFET 18 are connected in common to a word line (referred to as a "sub-word line" as well) WL. The word line driving circuit 10" further includes an NMOSFET 20 with a source thereof connected to the power supply VKK, a drain thereof connected to the word line WL, and a gate thereof connected to a signal RAIB (that is a complementary signal of the line RAI). The main word signal MWLB is a complementary signal (an inverted signal obtained by inverting a signal on a main word line MWL) of the main word line MWL (not shown) disposed in common in a plurality of sub-arrays to be driven by the word line driving circuits (sub-word drivers), respectively. The main word signal MWLB is set to a low level when the main word line MWL is selected, and is set to a high level (to a boosted voltage) when the main word line MWL is not selected. A driving power supply for the word line driving circuit (a sub-word driver circuit) provided corresponding to each of the sub-arrays is supplied from a signal (a sub-word decode signal) RAI at a high level when the word line driving circuit is selected. The signal RAI is supplied from a RAI driver circuit now shown. A back gate of the PMOSFET 12 in FIG. 8 is connected to a boosted voltage VPP.

Referring to FIG. 8, when the word line WL is selected (during a word line selection period), the main word signal MWLB is set to a low level, the signal RAI is set to a high level, the signal RAIB is set to a low level, the PMOSFET 12 is turned on, the NMOSFET 18 is turned off, and the word line WL is driven and charged to a potential (a boosted potential) RAI. Since the signal RAIB is low at this point, the NMOSFET 20 is also turned off.

When the word line WL is not selected, the signal RAI is set to a low level, and the signal RAIB is set to a high level. At this point, the NMOSFET 20 is turned on, thereby discharging, to a potential VKK, the word line WL which has been charged to the potential RAI when the word line was selected. In case wherein when the signal RAI is set to a low level and the word line WL is not selected, the main word signal MWLB is high, the NMOSFET 18 is turned on and discharges the word line WL, together with the NMOSFET 20. In case the main word signal MWLB is low (such as when a word line driving circuit for other sub-array connected to the same main word line is activated), discharging of the world line WL by the NMOSFET 20 is performed.

When a word line is not selected in the word line driving circuit 10" of the related art, a voltage difference between a gate of the transistor PMOSFET 12 and a drain of the transistor PMOSFET 12 becomes large. GIDL (Gate Induced Drain Leakage) will be therefore generated. In an example in FIG. 9 which will be described later, when a word line is not selected, the main word signal MWLB assumes 3.5V (that is a gate voltage of the PMOSFET 12), and the word line assumes −0.5V (that is a drain voltage of the PMOSFET 12). The voltage difference between the gate of the PMOSFET 12 and the drain of the PMOSFET 12 becomes 4.0V. The GIDL flows between a drain of a transistor and a substrate and between a source of the transistor and a substrate (as indicated by arrows (1) and (2)' in FIG. 8), depending on a voltage difference between a gate of the transistor and the drain of the transistor and a voltage difference between the gate of the transistor and the source of the transistor. Accordingly, the larger the above-mentioned voltage difference is, the larger the GIDL becomes.

When the dynamic memory is in a standby state, a word line is in a non-selected state except that refreshing is performed for each several tens of micro seconds. Then, the GIDL is generated almost constantly.

Figure 9:
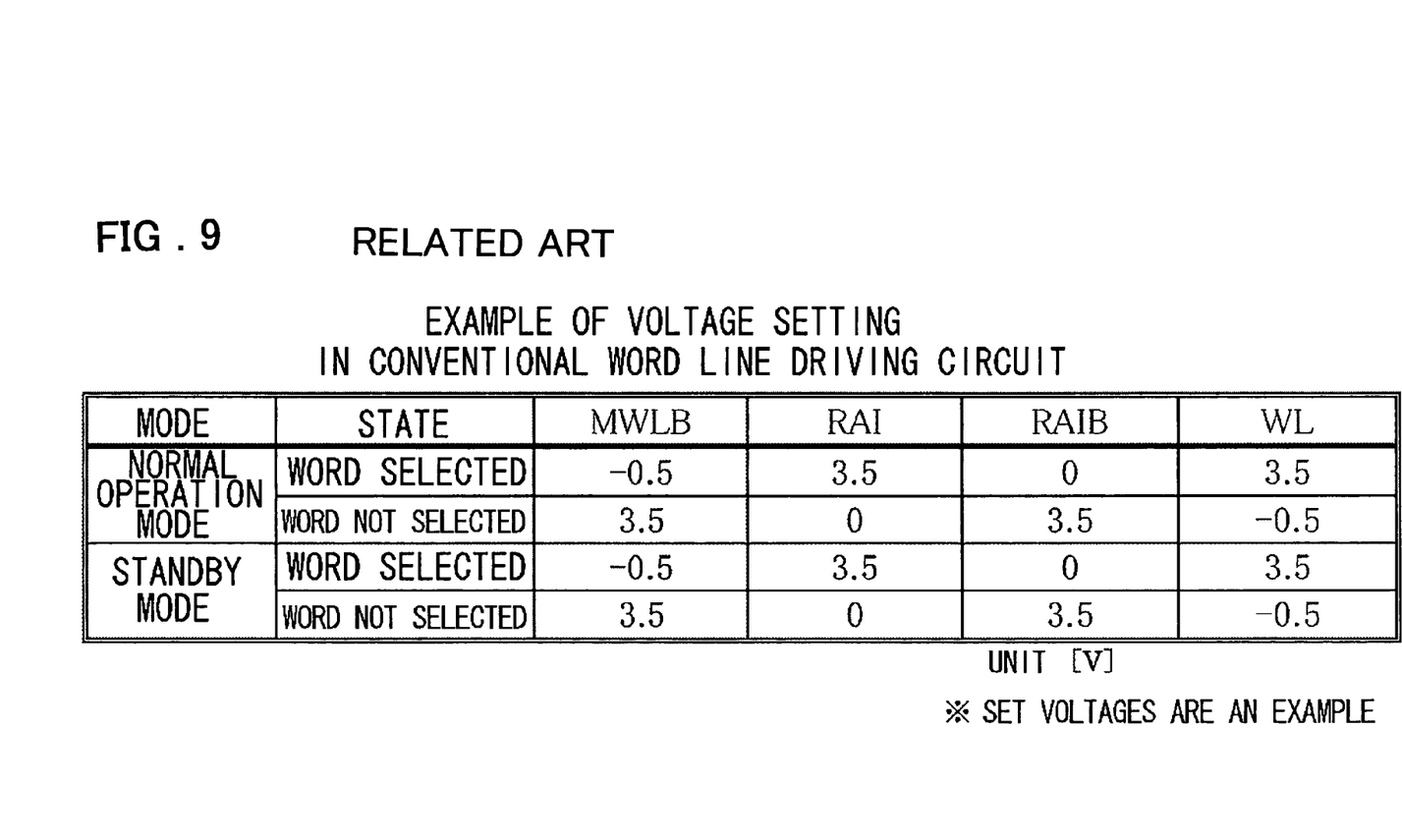
FIG. 9 is a table showing an example of voltage set-up in the word line driving circuit of the related art.

When voltage set-up as shown in FIG. 9 is performed as an example, and when a scale of memory cells is set to 256 M bits (megabits), the GIDL becomes 80 μA (at a high temperature), which is no negligibly large.

In order to reduce the standby current, reduction of the GIDL becomes important.

Patent Document 1, for example, discloses a configuration in which switching control is performed in order to reduce the GIDL. In this configuration, two types of voltages constituted from a boosted voltage that has the same potential as that of a selection level (a high level) of a word line and a voltage lower than the selection level (high level) of the word line are generated in an internal circuit. When the word line is not selected during an active period where a read/write operation to a memory cell is performed, the switching control is performed so that a line of the boosted voltage is connected to a gate of a PMOSFET in a word line driving circuit. On the other hand, when the word line is not selected during a standby period where the read/write operation to the memory cell is not performed, the switching control is performed so that a line of the voltage lower than the boosted voltage is connected to the gate of the PMOSFET in the word line driving circuit. By changing an input level to the PMOSFET between an active time and a standby time when the word line is not selected, as described above, a gate-to-drain voltage difference of the PMOSFET is reduced at the standby time, thereby reducing the GIDL. Though the GIDL remains large at the active time, the GIDL is smaller than a current required for performing the read/write operation. Thus, the GIDL at the active time does not cause problem.

Referring to a memory circuit including a word line driving circuit and a logic circuit in Patent Document 2, at the active time, a source electrode line of MOS transistors (NMOSFETs) is maintained at a ground potential. At the standby time, the source electrode line is switched to a level higher than a ground voltage. A gate-to-drain voltage difference at the standby time is thereby reduced (because when the word line is not selected, the NMOSFETs are turned on at the word line driving circuit, and a potential at the source electrode line of each of the NMOSFETs becomes a potential at a drain of a corresponding PMOSFET). The GIDL is therefore reduced.

Patent Document 3 discloses a configuration including a PMOSFET (Q9) with a source thereof connected to a power supply VDDQ, an NMOSFET (Q8) with a source thereof connected to a power supply VSS, and a PMOSFET (Q11) and an NMOSFET (Q10) connected in parallel between drains of the PMOSFET (Q9) and the NMOSFET (Q8), as an input circuit (an input voltage tracking type bias voltage generation circuit). Gates of the PMOSFET (Q11) and the NMOSFET (Q10) are connected to the power supplies VSS and VDDQ, respectively. Gates of the transistors PMOSFET (Q9) and NMOSFET (Q8) are connected to an input terminal VIN. Bias voltages are output to a differential amplifier circuit from drains of the PMOSFET (Q9) and NMOSFET (Q8), respectively. As described above, Patent Document 3 discloses the configuration in which the PMOSFETs are cascaded. However, Patent Document 3 discloses the input circuit, which is completely different from a driver of the present invention in terms of a problem and the configuration.

[Patent Document 1]
   JP Patent Kokai Publication No. JP-P-2005-158223A

[Patent Document 2]
   JP Patent Kokai Publication No. JP-P-2005-192234A

[Patent Document 3]
   JP Patent Kokai Publication No. JP-P-2000-306382A

SUMMARY OF THE DISCLOSURE

The entire disclosure of Patent Documents 1, 2 and 3 is incorporated herein by reference thereto. The following analyses are given by the present invention.

As described above, in Patent Document 1, a gate voltage at the standby time is switched from the level at the active time (at a time of a normal operation mode), thereby reducing the GIDL at the standby time.

In Patent Document 2, the source electrode line of the NMOSFETs at the standby time is switched to the level higher than the ground potential at the active time (at the time of the normal operation mode), thereby reducing the GIDL at the standby time.

Approaches described in Patent Documents 1 and 2 described above, however, have the following problem. The following problem has resulted from a study by the inventor of the present invention.

In Patent Documents 1 and 2 described above, switching of connection to a different potential is performed between the active time and the standby time. Accordingly, consumption of a current will be generated at a time of connection switching between different potentials, due to charging/discharging at a connection node.

For this reason, when switching between an active mode and a standby mode is frequency performed, the current at a standby time may be increased due to an influence of the charging/discharging current at the connection node, even though the GIDL itself at a standby time may be reduced.

The invention has been invented based on the result of study by the inventor, and is schematically configured as follows.

A driver circuit in accordance with one aspect of the present invention, comprises: a plurality of MOS transistors that, responsive to an input signal, drive an output; and a MOS transistor of a first conductivity type that is inserted in cascade connection to another MOS transistor of a first conductivity type which is among the plurality of MOS transistors. When the MOS transistor of the first conductivity type inserted in cascade connection is turned off, the MOS transistor of the first conductivity type in cascade connection receives at a gate thereof a potential different from a potential which is supplied to a gate of the another MOS transistor of the first conductivity type when the another MOS transistor of the first conductivity type is turned off.

In the driver circuit according to the present invention, a source of the MOS transistor of the first conductivity type inserted in cascade connection is connected to a drain of the another MOS transistor of the first conductivity type and a drain of the MOS transistor of the first conductivity type inserted in cascade connection is connected to a source of still another MOS transistor of the first conductivity type or a drain of an MOS transistor of a second conductivity type among the plurality of MOS transistors.

In the driver circuit according to the present invention, when the MOS transistor of the first conductivity type inserted in cascade connection is turned on, the MOS transistor of the first conductivity type in cascade connection receives at a gate thereof a potential which is identical to a potential supplied to a gate of the another MOS transistor of the first conductivity type when the another MOS transistor of the first conductivity type is turned on.

In the driver circuit according to the present invention, a signal supplied to the gate of the MOS transistor of the first conductivity type inserted in cascade connection may include a binary signal with an amplitude thereof set to be smaller than an amplitude of a signal supplied to a gate of the another MOS transistor.

In the driver circuit according to the present invention, a signal supplied to the gate of the MOS transistor of the first conductivity type inserted in cascade connection may well have a fixed potential.

In the driver circuit according to the present invention, the MOS transistor of the first conductivity type inserted in cascade connection is formed of a P-channel MOS transistor, and the gate potential of the P-channel MOS transistor, when the P-channel MOS transistor is turned off is set to be lower than the gate potential supplied to another P-channel MOS transistor among the plurality of MOS transistors, when the another P-channel MOS transistor is turned off.

In a semiconductor memory device according to the present invention, the driver circuit described above is included, as a word line driving circuit for driving a word line.

In the semiconductor memory device according to the present invention, the plurality of MOS transistors include a first P-channel MOS transistor and a first N-channel MOS transistor with gates thereof connected in common for receiving an input signal and sources thereof connected to a first power supply and a second power supply, respectively. The semiconductor memory device comprises: a second P-channel MOS transistor connected between drains of the first P-channel MOS transistor and the first N-channel MOS transistor as the MOS transistor of the first conductivity type inserted in cascade connection; and a connection node between drains of the second P-channel MOS transistor and the first N-channel MOS transistor is connected to the word line.

In the semiconductor memory device according to the present invention, when the input signal is high, a potential of the first power supply is set to a low level, and a gate potential of the second P-channel MOS transistor is set to a predetermined level lower than a high level of the input signal;

when the input signal is low, the potential of the first power supply is set to a high level, and the gate potential of the second P-channel MOS transistor is made identical to a low level of the input signal; and a potential of the second power supply is fixed at the potential being identical to the low level of the input signal.

In the semiconductor memory device according to the present invention, the input signal is set to a low level and a high level, when a main word line is selected and is not selected, respectively. The first power supply is supplied from a line of a decode signal with a potential thereof set to a high level when the word line is selected and with the potential thereof set to a low level when the word line is not selected. The semiconductor memory device further comprises: a second N-channel MOS transistor between the word line and the second power supply, the N-channel MOS transistor being turned on when the decode signal is at a low level.

In the semiconductor memory device according to the present invention, a potential corresponding to a high level of the selected word line is employed for a high level of the first power supply and a high level of the input signal.

The meritorious effects of the present invention are summarized as follows.

The present invention is configured as described above. When the word line is not selected, a gate-to-drain voltage difference of the P-channel MOS transistor can be thereby reduced. GIDL on a drain side can be therefore reduced.

According to the present invention, switching of connection to a different potential is not performed. Current consumption due to charging or discharging will not be therefore generated. A standby current can be thereby reduced.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

DETAILED DISCLOSURE OF THE INVENTION

Examples will be described with reference to appended drawings. In a word line driving circuit according to one aspect of the present invention, where gates of a P-channel MOS transistor (PMOSFET) (12) and an N-channel MOS transistor (NMOSFET) (18) are connected in common to an input signal, and sources of the PMOSFET (12) and the NMOSFET (18) are connected to a signal RAI and a power supply VKK, respectively, a PMOSFET (16) is inserted so that the PMOSFET (16) is cascade connected to the PMOSFET (12) (refer to FIG. 1). A high level of a signal (SEC) supplied to a gate of this PMOSFET (16) is set to be lower than a high level of an input signal (MWLB) supplied to the gates of the PMOSFET (12) and the NMOSFET (18).

Figure 1:
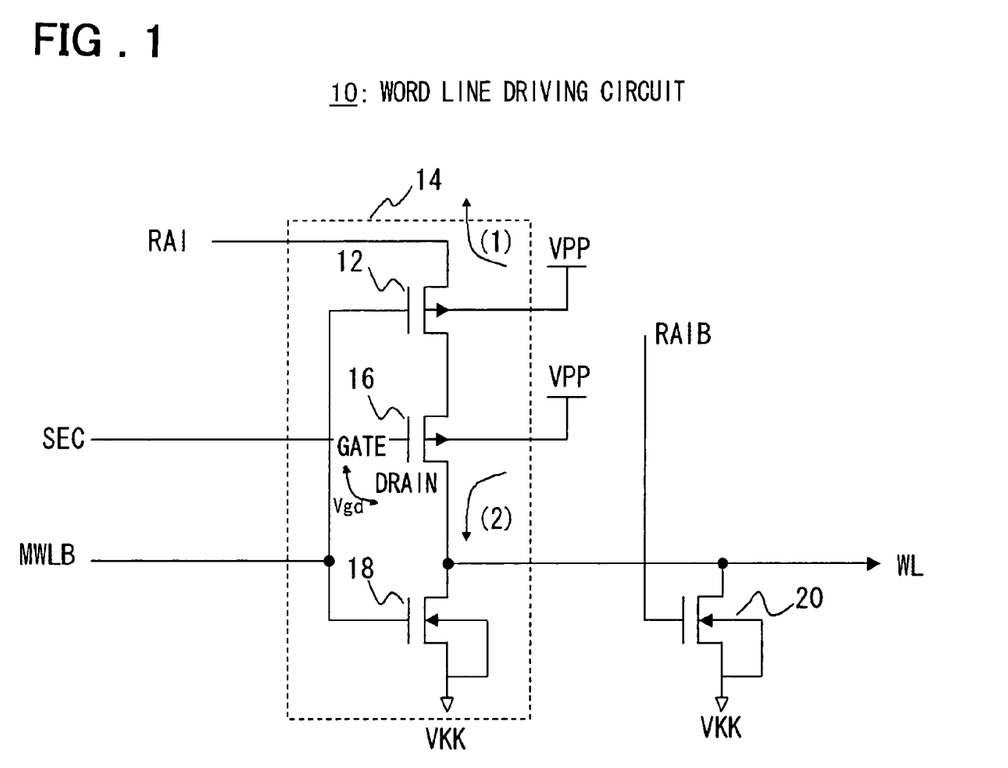
FIG. 1 is a diagram showing a configuration of a word line driving circuit in an example of the present invention.

When the signal MWLB is set to a high level and the signal RAI is set to a low level, that is, when a word line WL is not selected, a voltage difference between a gate and a drain of the PMOSFET (12) (a voltage difference between a high level of the signal SEC and a potential of the power supply VKK) can be reduced, thereby allowing reduction of GIDL on a drain side of the PMOSFET (12).

Referring to FIG. 1, a word line driving circuit 10 according to an example of the present invention, receives a main word signal MWLB that is an inverted of a main word line MWL, a sub-word decode signal RAI, a signal RAIB that is an inverted signal of the signal RAI, and a section signal SEC are supplied. When a main word line is selected, the main word signal MWLB is set to a low level. When the main word line is not selected, the main word line signal MWLB is set to a high level, and a boosted voltage is supplied to the main word line signal MWLB. When the word line driving circuit 10 is selected, the sub-word decode signal RAI is set to a high level (to the boosted voltage). When the word line driving circuit 10 is not selected, the sub-word decode signal RAI is set to a low level. An amplitude of the section signal SEC is smaller than that of the main word signal MWLB. A word driver (also referred to as a "sub-word driver") 14 includes a PMOSFET 12, an NMOSFET 18, and a PMOSFET 16. A source of the PMOSFET 12 is connected to the signal RAI. A source of the NMOSFET 18 is connected to the power supply VKK. A source of the PMOSFET 16 is connected to a drain of the transistor PMOSFET 12. A drain of the PMOSFET 12 is connected to a drain of the NMOSFET 18. The signal SEC is connected to the gate of the PMOSFET 16. The gates of the PMOSFET 12 and the NMOSFET 18 are connected in common to the main word signal MWLB (that goes low when a corresponding main word line MWL is selected). A connection node of the drains of the PMOSFET 16 and the NMOS- FET 18 is connected to the word line WL. The word line driving circuit 10 further includes an NMOSFET 20 with a source thereof connected to the power supply VKK, a drain thereof connected to the word line WL, and a gate thereof connected to the signal RAIB (that is the inverted signal of the signal RAI).

When the word line WL is selected, the signal MWLB goes low, the signal RAI that drives the word driver 14 goes high, the signal RAIB goes low, and the signal SEC goes low. Then, the PMOSFET 12 and the PMOSFET 16 are both turned on, and the NMOSFET 18 and the NMOSFET 20 are both turned off. The word line WL thereby assumes a boosted voltage level (high level).

On the other hand, when the word line is not selected, the signal MWLB goes high, the signal RAI goes low, the signal RAIB goes high, and the signal SEC goes high. The PMOSFET 12 and the PMOSFET 16 are both turned off, and the NMOSFET 18 and the NMOSFET 20 are both turned on. Then, the word line WL assumes a negative voltage level of the power supply VKK (low level). At this point, a gate potential of the PMOSFET 16 (=a high level of the signal SEC) is lower than a gate potential of the PMOSFET 12 (=a high level of the signal MWLB). Thus, the gate-to-drain voltage difference of the PMOSFET 12 can be reduced. The GIDL on the drain side of the PMOSFET 12 can be thereby reduced.

Figure 2:
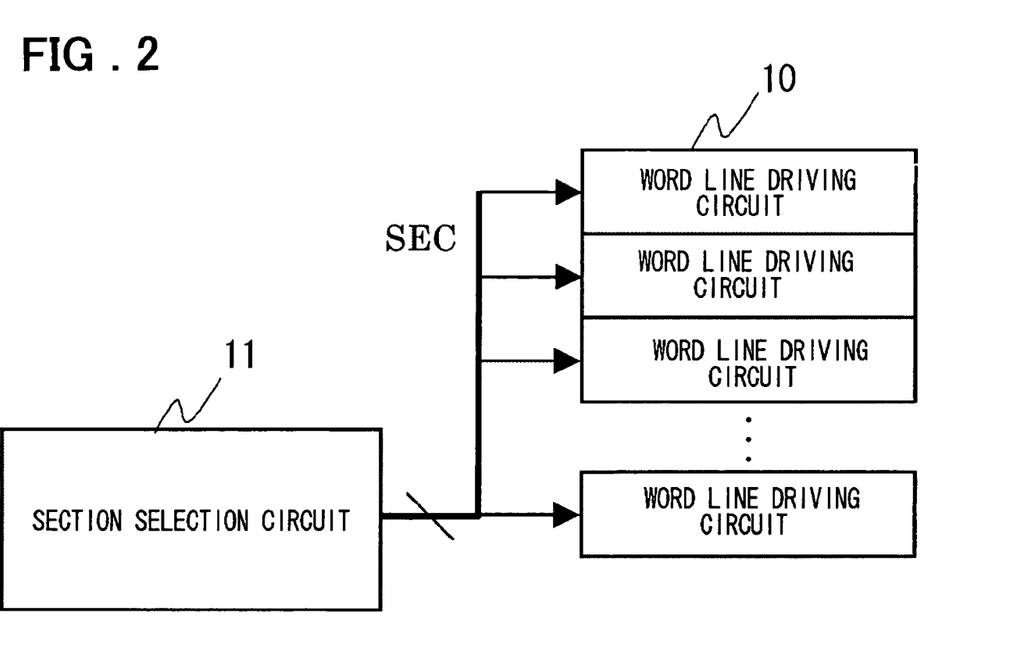
FIG. 2 is a block diagram showing a configuration of a memory circuit in the example of the present invention.

FIG. 2 is a diagram showing a configuration of a memory circuit in the example of the present invention. As shown in FIG. 2, the signal SEC for selecting a section is supplied in common to a plurality of the word line driving circuits 10. By allocating the signal SEC per section, a logic configuration for generating the signal SEC in a section selection circuit 11 is simplified. In a configuration where a plurality of word lines in a cell array is set to one section, and the cell array is divided into a plurality of sections, the section select signal SEC is generated within a ROW address decoder (an X decoder) that decodes a ROW address signal. When the cell array with 8K (=8192) word lines is divided into 32 sections, 256 word lines are included in each section. The signal SEC for selecting one section controls word line driving circuits (256 word line driving circuits) within the one section.

Figure 3A:
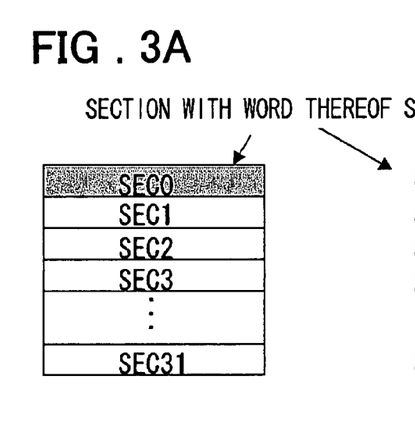
FIGS. 3A and 3B are diagrams for explaining an operation of a section select signal SEC in the example of the present invention.
Figure 3B:
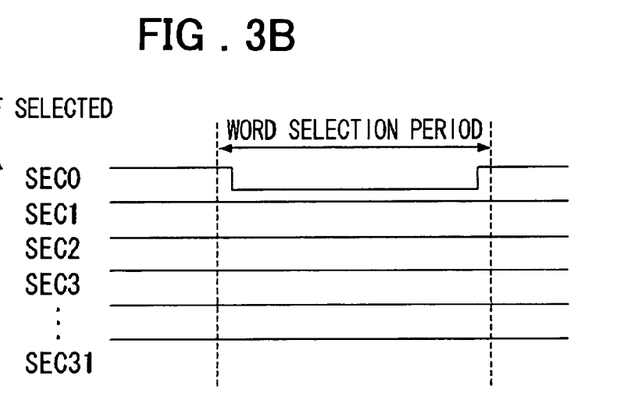

When the cell array includes 32 sections from SEC0 to SEC31 as shown in FIG. 3A, the section select signal SEC for only a section with a word line thereof selected is activated (driven low), thereby allowing suppression of operation current. As shown in FIG. 3B, a section select signal (SEC0) with the word line thereof selected is set to a low level just during a period when the word line is selected, and other section select signals SEC1 to SEC 31 are set to a high level. Meanwhile, a control signal supplied to the gate of the transistor PMOSFET 16 in FIG. 1 is not limited to the section select signal. Other arbitrary signal may be as a matter of course employed if the signal is a binary control signal with a high level thereof being lower than a high level of the signal MWLB.

Figure 4:
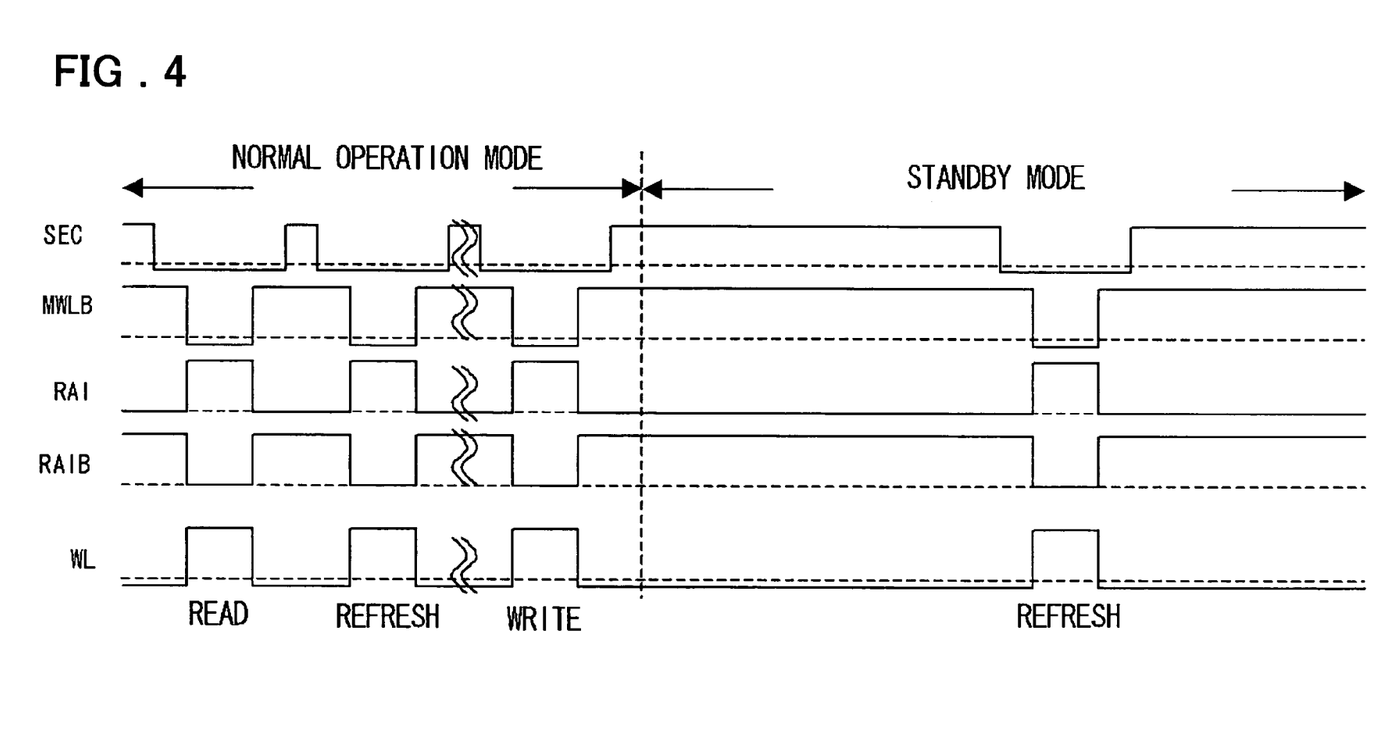
FIG. 4 is a diagram for explaining an operation of the circuit in the example of the present invention.

FIG. 4 is a timing diagram showing operations at a time of a normal operation (active) mode and at a time of a standby mode in the configuration of this example shown in FIG. 1. At the active time, a word line corresponding to an input address is selected at a time of a read/write operation and at a time of a refresh operation. A refresh address in the refresh operation may be generated inside a semiconductor memory instead of receiving the refresh address supplied from outside.

In an initial state, the signal SEC is high, the signal MWLB is high, the signal RAI is low, and the signal RAIB is high.

When input of one of a read command, a write command, and a refresh command is performed (though a request may be made from inside), the signal SEC for the section corresponding to the input address first transitions to low. The input address may be the refresh address generated inside at a time of a refresh.

Then, the signal MWLB corresponding to the input address goes low, the signal RAI for driving the selected word driver 14 goes high, and the signal RAIB goes low. PMOSFETs 12 and 16 are turned on, and the word line WL becomes a selected state (to have a high level of a line RAI). When a read operation, a write operation, or a refresh operation is completed, the signal MWLB goes high, the signal RAI goes low, and the signal RAIB goes high. Next, the signal SEC goes high, NMOSFETs 18 and 20 are turned on, the word line is discharged and becomes a non-selected state (to have a low level of the power supply VKK). By controlling the signal SEC as described above, the GIDL is reduced, without deteriorating an access speed.

At a time of standby, the word line corresponding to the input address (refresh address) is selected only when the refresh operation is performed. An operation of the word line driving circuit is the same as that at the active time.

When there is no access request to a cell (both at the active time and the standby time), all the signals SEC go high, the signal MWLB goes high, the signal RAI goes low, the signal RAIB goes high, and all the word lines WL become the non-selected state (go low).

At the standby time in particular, the word lines become the non-selected state except that refreshing is performed for each several ten microseconds. Accordingly, an effect of reduction of a standby current brought about by reduction of the GIDL is great.

As described above, even if the boosted voltage and the negative voltage VKK are employed in the word line driving circuit, the PMOSFET is provided in a cascaded manner, and a high level of a gate voltage for controlling the PMOSFET is set to be lower than a high level of the control signal for controlling driving of the word line driving circuit, thereby reducing the voltage difference between a gate and a drain of a PMOSFET. The GIDL on the drain side of the PMOSFET can be therefore reduced.

Figure 5A:
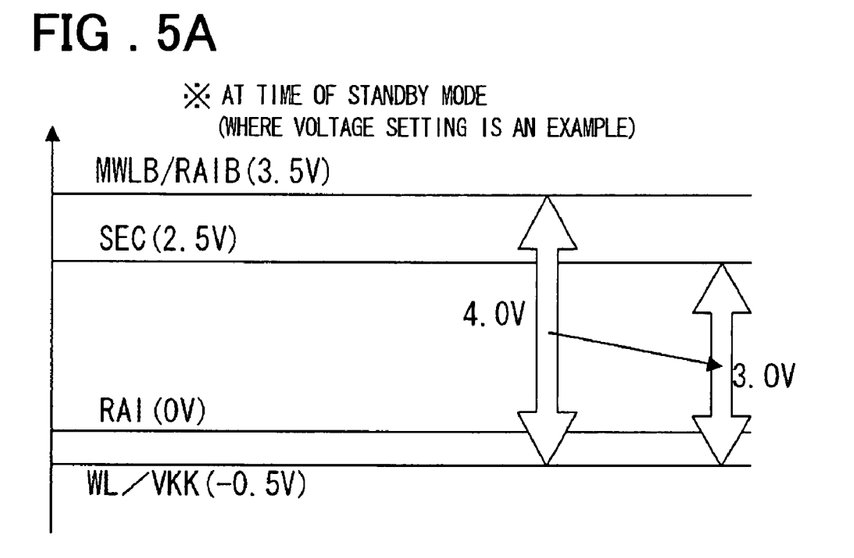
FIGS. 5A and 5B are a diagram and a graph showing a GIDL characteristic of the word line driving circuit in the example of the present invention.

FIG. 5A shows voltage set-up examples of the signals MWLB, SEC, RAIB, RAI, and WL/VKK at the time of the standby mode in this example. The signal MWLB is set to 3.5V, the signal SEC is set to 2.5V, the signal RAIB is set to 3.5V, the signal RAI is set to 0V, and the signal WL/VKK is set to −0.5V. In the case of FIG. 8, a potential difference between the signal MWLB of 3.5V and the signal VKK of −0.5V is 4.0V. According to the present invention, a potential difference between a high level of the signal SEC of 2.5V and the signal VKK of −0.5V is 3.0V. While the gate-to-drain voltage of the PMOSFET 12 is 4.0V in a configuration in FIG. 8 with no measures against the GIDL taken in the standby mode, the gate-to-drain voltage in this example becomes 2.5V−(−0.5V of the signal VKK)=3.0V in the standby mode. The gate-to-drain voltage is therefore reduced.

Figure 5B:
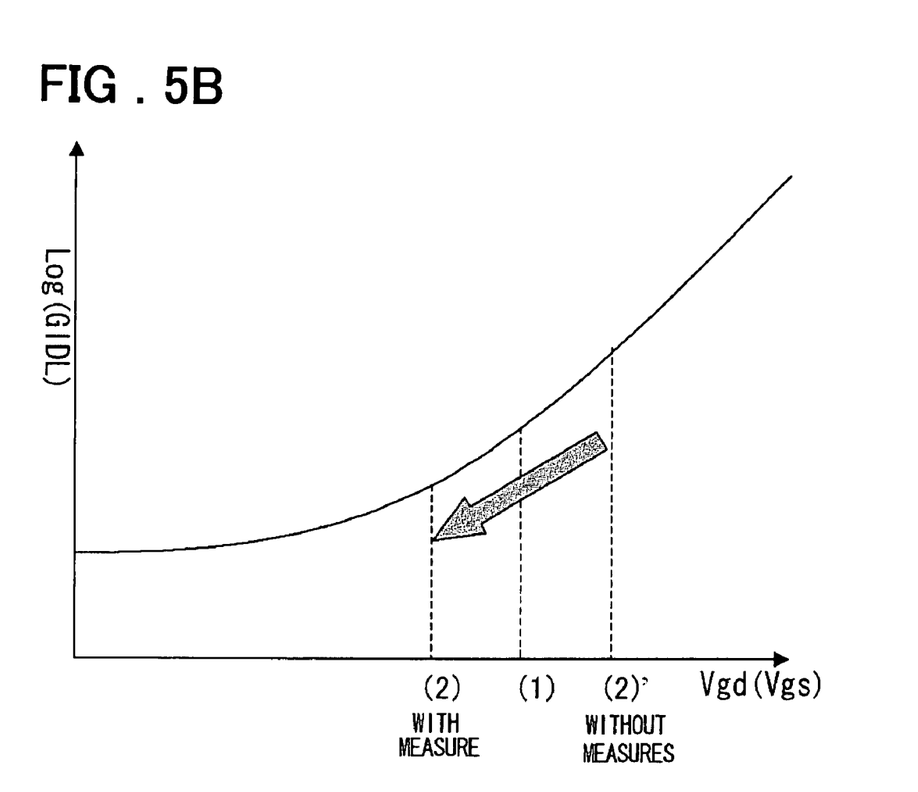

FIG. 5B shows a gate-to-drain voltage Vgd (2) of the PMOSFET 16 in this example (refer to FIG. 1) in contrast with a gate-to-drain voltage Vgd (2)' of the PMOSFET 12 when there are no measures against the GIDL (refer to FIG. 8). Referring to FIG. 5B, a horizontal axis indicates a gate-to-drain voltage Vgd, while a vertical axis indicates the GIDL in a logarithmic (Log) scale. Reference numeral (1) in FIG. 5B indicates a gate-to-source voltage Vgs of the PMOSFET 12 (refer to FIGS. 1 and 8).

Figure 6:
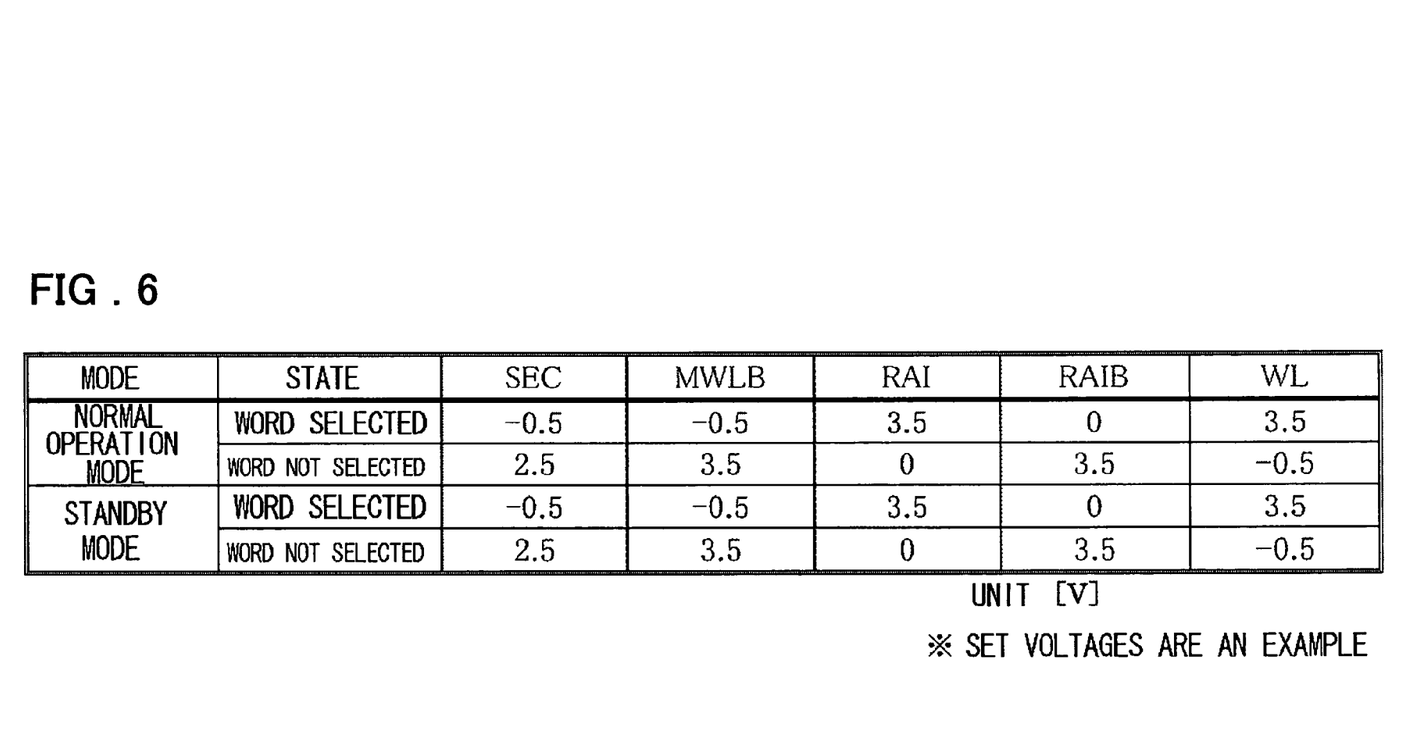
FIG. 6 is a table showing an example of voltage set-up in the word line driving circuit in the example of the present invention.

In this example, voltage set-up as shown in FIG. 6 may be performed. With respect to amplitudes of the respective signals, the amplitudes of the signal SEC are set to −0.5V and 2.5V, the amplitudes of the signal MWLB are set to −0.5V and 3.5V, the amplitudes of each of the signals RAI and RAIB are set to 0 and 3.5V, and the amplitude of the signal WL are set to −0.5V and 3.5V. In control over the signal SEC at the standby time, the signal SEC corresponding to the section for the selected word line is turned on during the period when the word line is activated, as described before. The GIDL on a scale of memory cells of 256 M bits becomes 8 micro A (at a time of a high temperature), which means that the GIDL is reduced to approximately 1/10, compared with a case shown in FIG. 8 or the like, where no measures have been taken.

In an example of the voltage set-up shown in FIG. 6, the potential of 2.5V is set to one of internal supply voltages in a dynamic memory device, and an existing supply potential supplied from a power supply circuit (not shown) of the dynamic memory device is employed as the potential of 2.5V, as with 3.5V, a GND potential, and −0.5V. In this example, a dedicated power supply is not used for a high level of the SEC signal. A high level (VOH) of the signal SEC is not limited to 2.5V, and provision of the dedicated power supply for a high level of the signal SEC is not excluded.

In this example, a configuration as in Patent Documents 1 and 2, where switching of connection to a different potential between the active time and the standby time is performed, is not employed. Thus, current consumption due to charging or discharging at a node is not generated. As a result, according to this example, even if switching between active and standby modes is frequently performed, a problem that the standby current increases to the contrary due to the charging and discharging will not arise.

Figure 7:
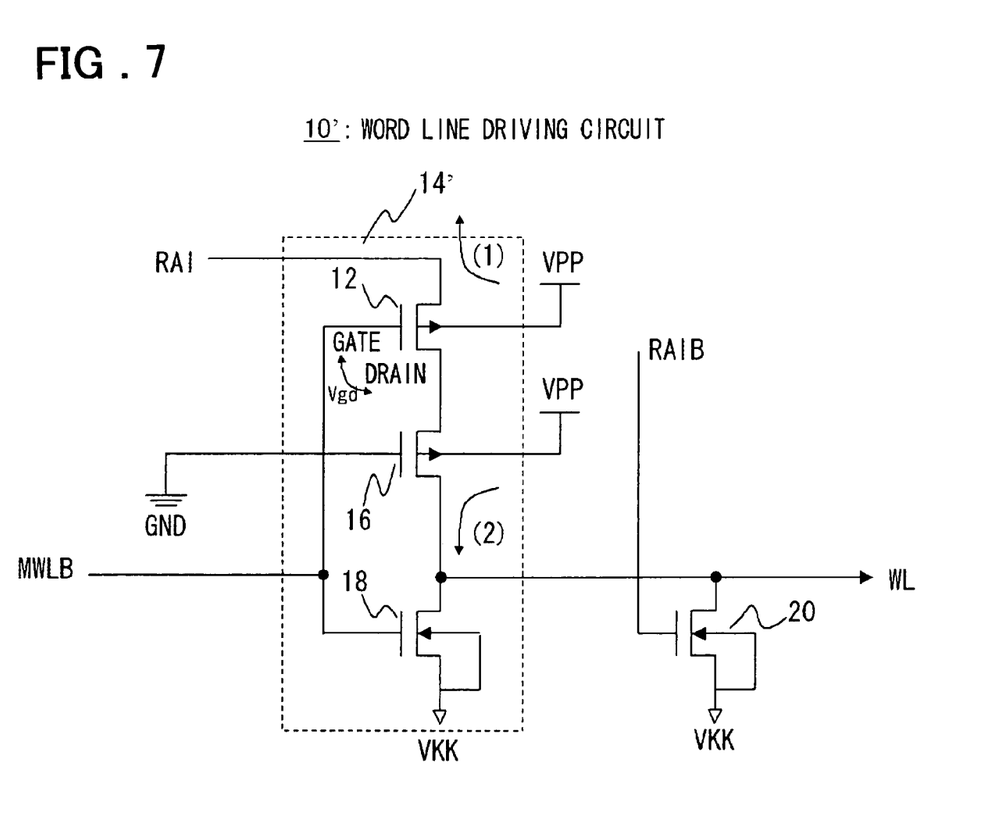
FIG. 7 is a diagram showing a configuration of a word line driving circuit in other example of the present invention.

FIG. 7 is a diagram showing a configuration of other example of the present invention. Referring to FIG. 7, in this example, a level of the section select signal SEC is fixed at a GND level in the example shown in FIG. 1. VKK level may also be used in place of the GND level. That is, the level of the section select signal SEC in FIG. 1 is changed to the level of a GND or the power supply VKK.

When the word line is not selected, a drain level of the PMOSFET 12 is floated according to a threshold voltage of the PMOSFET 16, and the gate-to-drain voltage difference of the PMOSFET 12 is thereby reduced. The GIDL can be thereby reduced. The size of the PMOSFET is optimized so that both of the access speed and GIDL reduction may be satisfied. According to this example, the need for controlling the signal SEC is eliminated. Thus, logic simplification can be achieved.

Each of the examples described above has the following operation and effect.

Even if the boosted voltage or the negative voltage is employed for controlling a word line, the standby current caused by the GIDL can be suppressed.

Further, even if switching between active and standby modes is frequently performed, it does not happen that the standby current is increase due to the charging and discharging.

In the examples described above, a description was given using a configuration of the PMOSFET cascaded with the PMOSFET connected in series with the NMOSFET between the power supplies of the different potentials, as an example. The PMOSFETs are cascaded in two stages. The present invention is not limited to such a configuration, and can be of course applied to a driver formed of a plurality of MOSFETs connected in series between power supplies of different potentials. In a configuration where a plurality of PMOSFETs are connected on a higher potential power supply side and at least one NMOSFET is provided on a lower potential supply side, a PMOSFET to be inserted for cascade connection may be inserted between any adjacent two of the PMOSFETs.

In the examples described above, a description was given, using a semiconductor memory device having a hierarchical word line structure including the main word line and a sub-word line as an example. An application of the present invention is not limited to the word line driving circuit (sub-word driver) of the semiconductor memory device with the hierarchical word line structure, and can be applied to an arbitrary driver circuit that requires a measure against the GIDL caused by a gate-to-drain difference voltage of the MOSFET when the word line is not selected.

The above description was given in connection with the examples described above. The present invention is not limited to the configurations of the examples described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A driver circuit comprising:
   a plurality of MOS transistors that, responsive to an input signal, drive an output; and
   a first MOS transistor of a first conductivity type that is inserted in cascade connection to a second MOS transistor of a first conductivity type which is among said plurality of MOS transistors; wherein
   when said first MOS transistor is turned off, said first MOS transistor receives at a gate thereof a potential different from a potential which is supplied to a gate of said second MOS transistor when said second MOS transistor is turned off, wherein a signal supplied to said gate of said first MOS transistor includes a binary signal with an amplitude thereof set to be smaller than an amplitude of a signal supplied to a gate of said second MOS transistor.

2. The driver circuit according to claim 1, wherein a source of said first MOS transistor is connected to a drain of said second MOS transistor and a drain of said first MOS transistor is connected to a source of a third MOS transistor of the first conductivity type or a drain of a fourth MOS transistor of a second conductivity type among said plurality of MOS transistors.

3. The driver circuit according to claim 1, wherein, when said first MOS transistor is turned on, said first MOS transistor receives at a gate thereof a potential which is identical to a potential supplied to a gate of said second MOS transistor when said third MOS transistor is turned on.

4. The driver circuit according to claim 1, wherein a signal supplied to said gate of said first MOS transistor has a fixed potential.

5. The driver circuit according to claim 1, wherein said first MOS transistor is formed of a P-channel MOS transistor, and the gate potential of said P-channel MOS transistor, when said P-channel MOS transistor is turned off is set to be lower than the gate potential supplied to another P-channel MOS transistor among said plurality of MOS transistors, when said another P-channel MOS transistor is turned off.

6. A semiconductor memory device comprising:
   the driver circuit as set forth in claim 1, as a word line driving circuit for driving a word line.

7. The semiconductor memory device according to claim 6, wherein
said plurality of MOS transistors include a first P-channel MOS transistor and a first N-channel MOS transistor with gates thereof connected in common for receiving an input signal and sources thereof connected to a first power supply and a second power supply, respectively;
the semiconductor memory device comprising:
a second P-channel MOS transistor connected between drains of said first P-channel MOS transistor and said first N-channel MOS transistor as said MOS transistor of the first conductivity type inserted in cascade connection;
a connection node between drains of said second P-channel MOS transistor and said first N-channel MOS transistor being connected to the word line.

8. The semiconductor memory device according to claim 7, wherein
when the input signal is high, a potential of said first power supply is set to a low level, and a gate potential of said second P-channel MOS transistor is set to a predetermined level lower than a high level of the input signal;
when the input signal is low, the potential of said first power supply is set to a high level, and the gate potential of said second P-channel MOS transistor is made identical to a low level of the input signal; and
a potential of said second power supply is fixed at the potential being identical to the low level of the input signal.

9. The semiconductor memory device according to claim 7, wherein the input signal is set to a low level and a high level, when a main word line is selected and is not selected, respectively;
said first power supply is supplied from a line of a decode signal with a potential thereof set to a high level when the word line is selected and with the potential thereof set to a low level when the word line is not selected; and wherein
the semiconductor memory device further comprises:
a second N-channel MOS transistor between the word line and said second power supply, said N-channel MOS transistor being turned on when the decode signal is at a low level.

10. The semiconductor memory device according to claim 7, wherein a potential corresponding to a high level of the selected word line is employed for a high level of said first power supply and a high level of the input signal.

11. A word line driving circuit comprising:
first and second MOS transistors with gates thereof connected in common for receiving an input signal and sources thereof connected to a first power supply and a second power supply, respectively, conductivity types of said first and second MOS transistors being different to each other; and
a third MOS transistor inserted between a drain of said first MOS transistor and a drain of said second MOS transistor, a conductivity type of said third MOS transistor being the same as a conductivity type of said first MOS transistor;
a connection node between said drain of said second MOS transistor and a drain of said third MOS transistor being connected to a word line; wherein a potential different from a potential of the input signal is supplied to a gate of said third MOS transistor when the potential of the input signal turns off said first MOS transistor and turns on said second MOS transistor; and
a potential being the same as a potential of the input signal is supplied to said gate of said third MOS transistor when the potential of the input signal turns on said first MOS transistor and turns off said second MOS transistor.

12. The word line driving circuit according to claim 11, wherein a section select signal is connected to said gate of said third MOS transistor, a high level of the section select signal is set to be lower than a high level of the input signal, and the section select signal for a section including the selected word line takes a low level during a word line activation period and takes a high level otherwise.

13. The word line driving circuit according to claim 11, wherein
said first and third MOS transistors are P-channel MOS transistors;
said second MOS transistor is an N-channel MOS transistor;
the input signal is set to a low level and a high level when a main word line is selected and is not selected, respectively;
said first power supply is supplied from a line of a decode signal with a potential thereof set to high when the word line is selected and with the potential thereof set to low when the word line is not selected;
a potential of said second power supply is fixed at a low level of the input signal;
when the word line is not selected, the potential of the input signal is set to a high level, the potential of said first power supply is set to a low level, and the gate potential of said third MOS transistor is set to a predetermined potential lower than a high level of the input signal; and
when the word line is selected, the potential of the input signal is set to a low level, the potential of said first power supply is set to a high level, and the gate potential of said third MOS transistor is made identical to the potential of the input signal.

14. The word line driving circuit according to claim 13, further comprising:
an MOS transistor of a second conductivity type for discharging, said MOS transistor being provided between the word line and said second power supply, said MOS transistor being turned on when the decode signal has a low level.

15. The word line driving circuit according to claim 11, wherein a binary signal with an amplitude thereof set to be smaller than an amplitude of the input signal is supplied to said gate of said third MOS transistor.

16. The word line driving circuit according to claim 11, wherein said gate of said third MOS transistor is supplied with a fixed potential that turns on said third MOS transistor.

17. The word line driving circuit according to claim 16, wherein the fixed potential is set to be the same as a ground potential or a low level of the input signal.

18. A semiconductor memory device comprising: the word line driving circuit as set forth in claim 11.

* * * * *